(12) United States Patent
Brown (10) Patent No.: US 12,006,070 B2
(45) Date of Patent: Jun. 11, 2024

(54) METHOD AND APPARATUS FOR SPACE-BASED COLLECTION AND USE OF PHOTONIC POWER

(71) Applicant: Trevor Brown, Lake Geneva, WI (US)

(72) Inventor: Trevor Brown, Lake Geneva, WI (US)

(73) Assignee: Trevor Brown, Lake Geneva, WI (US)

( * ) Notice: Subject to any disclaimer, the term of this patent is extended or adjusted under 35 U.S.C. 154(b) by 225 days.

(21) Appl. No.: 17/735,506

(22) Filed: May 3, 2022

(65) Prior Publication Data

US 2022/0371753 A1  Nov. 24, 2022

Related U.S. Application Data

(60) Provisional application No. 63/191,432, filed on May 21, 2021.

(51) Int. Cl.
| | |
|---|---|
| *B64G 1/44* | (2006.01) |
| *B64G 1/22* | (2006.01) |
| *H01L 25/16* | (2023.01) |
| *H01Q 3/34* | (2006.01) |

(52) U.S. Cl.
CPC .......... *B64G 1/443* (2013.01); *B64G 1/222* (2013.01); *H01L 25/167* (2013.01); *H01Q 3/34* (2013.01)

(58) Field of Classification Search
None
See application file for complete search history.

(56) References Cited

U.S. PATENT DOCUMENTS

| | | | | | |
|---|---|---|---|---|---|
| 4,360,741 | A | * | 11/1982 | Fitzsimmons | .......... H02J 50/70 307/151 |
| 6,087,991 | A | * | 7/2000 | Kustas | .......... H01Q 21/08 244/172.7 |
| 9,570,795 | B1 | * | 2/2017 | Bruce | .......... H01Q 1/287 |
| 11,623,768 | B2 | * | 4/2023 | Halperin | .......... B64G 1/443 244/158.1 |
| 2005/0001167 | A1 | * | 1/2005 | Garmer | .......... G08B 25/10 250/347 |
| 2010/0008052 | A1 | * | 1/2010 | Martin | .......... H01Q 1/38 361/748 |

(Continued)

OTHER PUBLICATIONS

Written Opinion of the International Search Authority for PCT/US22/29559; dated Sep. 6, 2022. (Year: 2022).*

*Primary Examiner* — Bernarr E Gregory
(74) *Attorney, Agent, or Firm* — FITCH EVEN TABIN & FLANNERY, LLP (57) ABSTRACT

An apparatus comprises both a first side and a second side that is opposite the first side. The apparatus includes a plurality of photovoltaic cells disposed on the first side of the substrate and a plurality of microwave antennas disposed on both the first side of the substrate and the second side of the substrate. In addition, the apparatus comprises at least one photonic integrated circuit operably coupled to the substrate and to at least one of the plurality of photovoltaic cells to thereby receive electrical power therefrom. By one approach, the apparatus can further comprise at least one atomic clock supported by the substrate. By one approach, at least some of the aforementioned plurality of microwave antennas that are disposed on the first side of the substrate can comprise an optically transparent portion that serves as both a protective cover and a focusing lens.

20 Claims, 5 Drawing Sheets

(56) References Cited

U.S. PATENT DOCUMENTS

| | | | | |
|---|---|---|---|---|
| 2013/0009851 A1* | 1/2013 | Danesh | ................ | H01L 31/075 343/904 |
| 2013/0099599 A1* | 4/2013 | Jaffe | ................ | H01L 31/042 136/246 |
| 2013/0249757 A1* | 9/2013 | Leung | ................ | H01Q 9/0485 343/785 |
| 2014/0103735 A1* | 4/2014 | Chang | ................ | H01L 31/042 307/104 |
| 2020/0395789 A1* | 12/2020 | Hyland | ................ | B64G 1/443 |

* cited by examiner

METHOD AND APPARATUS FOR SPACE-BASED COLLECTION AND USE OF PHOTONIC POWER

RELATED APPLICATION(S)

This application claims the benefit of U.S. Provisional application No. 63/191,432, filed May 21, 2021, which is incorporated by reference in its entirety herein.

TECHNICAL FIELD

These teachings relate generally to the collection and use of photonic energy, and more particularly to such collection and use in a non-terrestrial context.

BACKGROUND

So-called outer space is often characterized as a dark place. While the background may often appear to be, for the most part, black, many places in fact receive light (for example, from one or more stars). And that available light can serve in various useful ways when properly harnessed. While the prior art reveals numerous approaches to attempting to capitalize in such regards, for the most part a typical prior art solution is lacking in any of a variety of ways. Examples include, but are not limited to, undue (even debilitating) expense, great complexity, challenging deployment and/or operational requirements, challenging inefficiencies, thermal issues, and so forth.

BRIEF DESCRIPTION OF THE DRAWINGS

The above needs are at least partially met through provision of the apparatus and method for space-based collection and use of photonic power described in the following detailed description, particularly when studied in conjunction with the drawings, wherein.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein. The word "or" when used herein shall be interpreted as having a disjunctive construction rather than a conjunctive construction unless otherwise specifically indicated.

DETAILED DESCRIPTION

Generally speaking, pursuant to these various embodiments, an apparatus comprises both a first side and a second side that is opposite the first side. The apparatus also includes a plurality of photovoltaic cells disposed on the first side of the substrate and a plurality of microwave antennas disposed on both the first side of the substrate and the second side of the substrate. In addition, the apparatus comprises at least one photonic integrated circuit operably coupled to the substrate and to at least one of the plurality of photovoltaic cells to thereby receive electrical power therefrom. By one approach, the apparatus can further comprise at least one atomic clock supported by the substrate. By one approach, at least some of the aforementioned plurality of microwave antennas that are disposed on the first side of the substrate can comprise an optically transparent portion that serves as both a protective cover and a focusing lens.

By one approach the substrate comprises a flexible substrate. These teachings will accommodate a variety of form factors for the substrate, but for many application settings the substrate can comprise a sphere. By one approach, the substrate can be selectively shifted from a collapsed non-spherical state to a deployed spherical state.

By one approach, the aforementioned at least one photonic integrated circuit comprises a plurality of photonic integrated circuits, wherein at least some of the photonic integrated circuits are communicatively coupled via corresponding waveguides. When so configured, the apparatus can serve to process data and information and/or can possess and utilize onboard digital memory. In lieu of the foregoing or in combination therewith, if desired, at least one of the photonic integrated circuits can be operably coupled to communicate via at least one of the plurality of microwave antennas. Such communications can be intra-apparatus communications and/or external-apparatus communications.

The aforementioned one or more photonic integrated circuits can be configured to serve a variety of purposes as desired. By one approach, for example, at least one such photonic integrated circuit can be configured to detect atmospheric phenomena (including atmospheric phenomena in the surrounding vicinity of the apparatus and/or at a remote distance from the apparatus). By another approach, in lieu of the foregoing or in combination therewith, at least one such photonic integrated circuit can be configured to detect celestial phenomena. By yet another approach, at least one of these photonic integrated circuits can be configured to communicate using quantum entanglement.

The apparatus itself can be configured to support a variety of useful purposes. As one example, the apparatus can be configured to form one pole of a geo-electromagnetic field that envelops a celestial body (such as a planet, moon, asteroid and so forth). In such a case, and by one approach, an opposing second pole of that geo-electromagnetic field can be generated by another apparatus that corresponds to the celestial body itself. As another example, this apparatus can be configured, at least in part, as a retro-directive phased array long-range power transmission apparatus.

These teachings will support disposing the aforementioned apparatus aboard a space launch vehicle and then launching that space launch vehicle into space. The apparatus can then be deployed in space into, for example, a spherical non-collapsed shape. Such deployment may be effected via a mechanical approach and/or by inflating the apparatus into that shape. So deployed, the apparatus can be utilized to perform one or more desired functionalities.

For example, the deployed apparatus may be employed to generate a geo-electromagnetic field by converting, at least in part, photonic energy captured by at least some of the plurality of photovoltaic cells. By one approach, the deployed apparatus can transmit power within the apparatus across an interior void of the spherical non-collapsed shape from at least some of the microwave antennas disposed on the second side of the substrate to at least others of the microwave antennas.

When at least some of the plurality of microwave antennas that are disposed on the first side of the substrate comprise transparent microwave antennas, these teachings will support employing the transparent microwave antennas to establish optical feedback via, at least in part, emplacement of an active medium within a resonating cavity.

Figure 1:
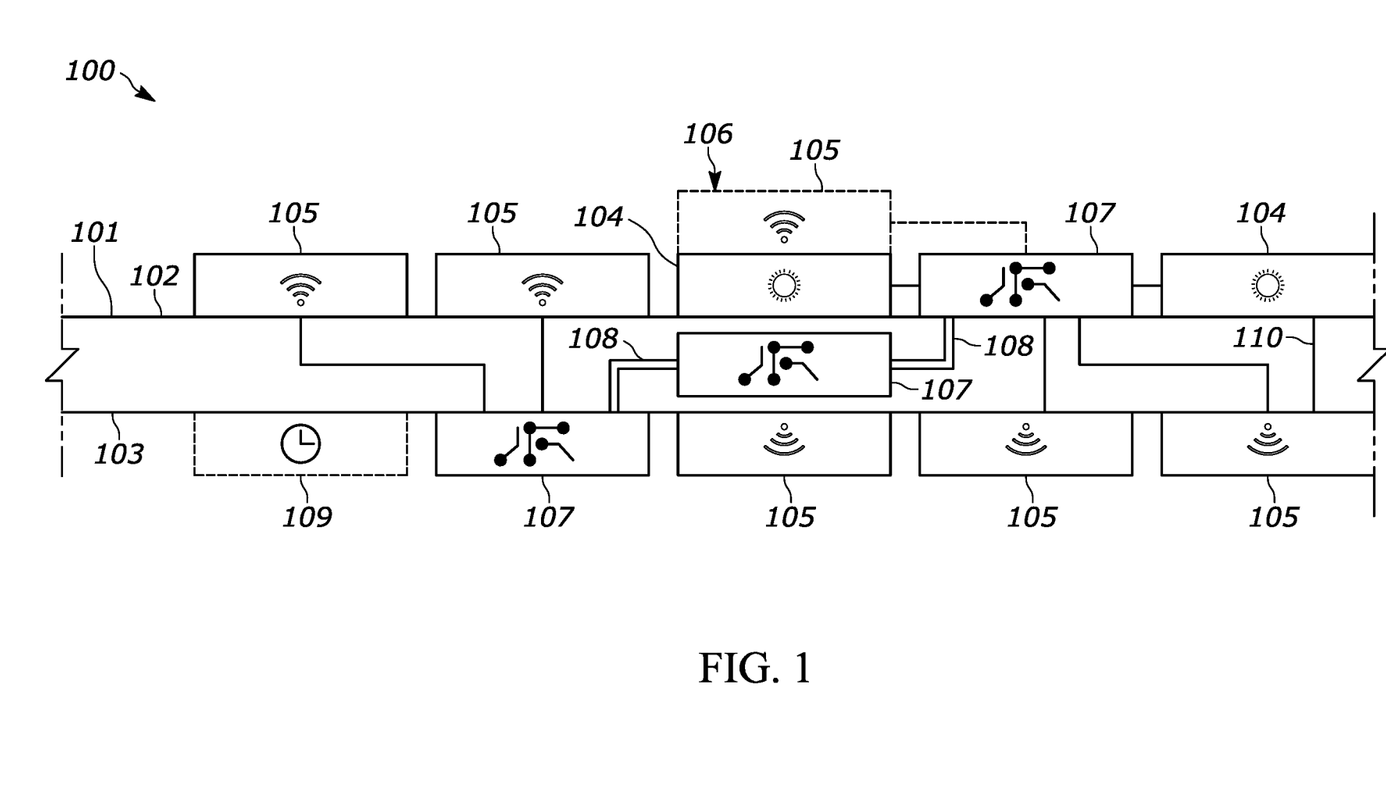
FIG. 1 comprises a block diagram as configured in accordance with various embodiments of these teachings.

These and other benefits may become clearer upon making a thorough review and study of the following detailed description. Referring now to the drawings, and in particular to FIG. 1, an illustrative apparatus 100 that is compatible with many of these teachings will now be presented.

In this illustrative example, the apparatus 100 includes a substrate 101. This substrate 101 has a first side 102 and a second side 103 that is opposite the first side 102. This substrate 101 can be as flexible or as resilient as desired to best suit the needs of a given application setting. For many useful application settings, the substrate 101 may have a thickness ranging between, for example, 100 or 200 nanometers to, say, thirty, forty, or fifty microns. The substrate 101 may be comprised of a single material or may comprise a laminate structure having two or more layers of differing materials such as a polymer, mylar, or Kapton material. By one approach, one or more such layers may be comprised of electrically insulating materials. That said, the substrate 101 may also comprise an electrically conductive layer (not shown) that can serve as, for example, a ground plane.

By one approach, this substrate 101 comprises a flexible material that can be packaged and/or transported in a collapsed state. In such a case, the substrate 101 can then be selectively shifted from the collapsed state to a deployed state. Such deployment may be effected as desired. By one approach, for example, the deployment may be effected by a mechanical mechanism such as an expandable rigid framework. By another approach, and as another example, the deployment may be effected by inflating a closed body comprised of the substrate 101.

Figure 2:
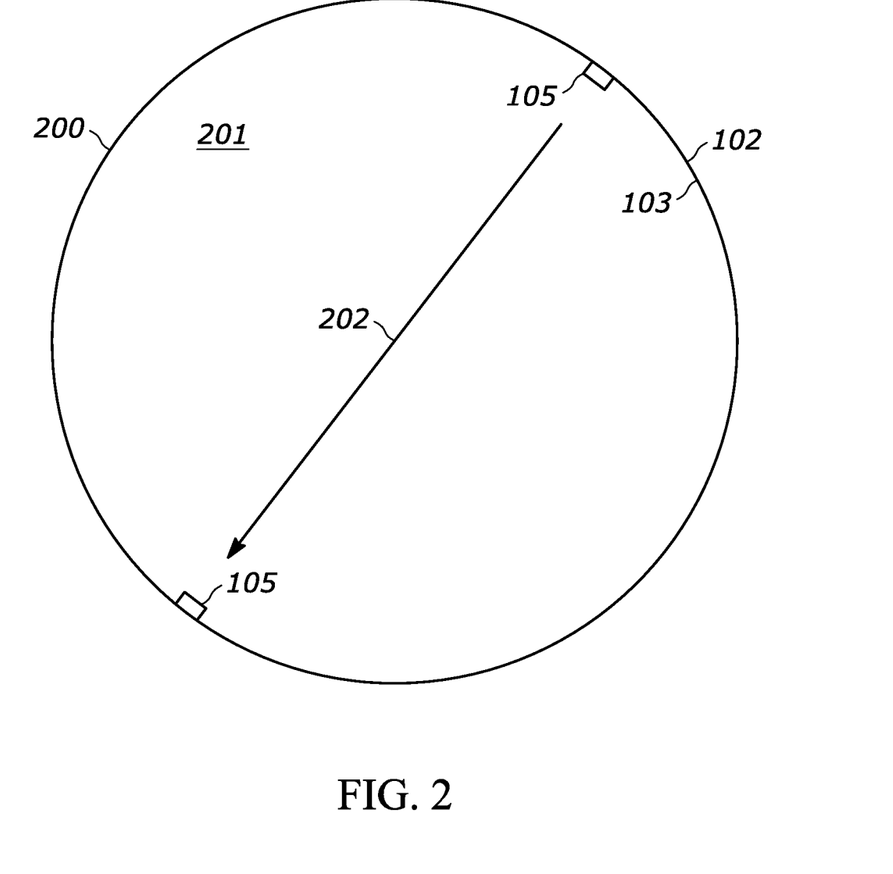
FIG. 2 comprises a schematic view as configured in accordance with various embodiments of these teachings.

For example, and referring momentarily to FIG. 2, the substrate 101 may comprise a sphere 200 that can be inflated by introducing an appropriate pressurized gas 201 into the interior thereof. In such a case, the aforementioned first side 102 of the substrate 101 may comprise the exterior side of the sphere 200. Similarly, the aforementioned second side 103 of the substrate 101 may comprise the interior side of the sphere 200. These teachings will accommodate various sizes of such a sphere 200. Such a sphere 200 may have a diameter, for example, ranging from 10 m to 10 km to 300 km.

While a spherical shape can be beneficial to suit the purposes of many different application settings, and while the remainder of this description will presume such a shape, it will be understood that other shapes are possible and that these teachings are not to be viewed as being limited in such regards.

Referring again to FIG. 1, the apparatus 100 includes a plurality of photovoltaic cells 104 disposed on the first side 102 of the substrate 101. Some or all of these photovoltaic cells 104 may be disposed in groups of adjacent cells or, in lieu of the foregoing or in combination therewith, at least some of the photovoltaic cells 104 may be physically interspersed with other non-photovoltaic cell components. Generally speaking, these photovoltaic cells 104 serve to generate electricity in the presence of light, such as light being sourced by a star such as the Earth's sun or by some light-emitting human-made beacon. Various materials and designs for photovoltaic cells are known in the art. It may also be noted that such photovoltaic cells can be formed on/attached to the substrate 101 via a three-dimensional additive material printing process. As the present teachings are not overly sensitive to any particular choices in these regards, further details are not provided here in these regards for the sake of brevity.

The apparatus 100 also includes a plurality of microwave antennas 105 that are disposed on both the first side 102 of the substrate 101 and on the second side 103 of the substrate 101. By one approach these microwave antennas 105 can each comprise relatively small patch antennas. Patch antennas are well known in the art and are a type of antenna having a low profile that can be mounted on a surface. For such an antenna to be resonant, a length of microstrip transmission line will be slightly shorter than one-half the wavelength at the frequency being used. Accordingly, at microwave frequencies the wavelengths are short enough that the patches are conveniently small. It will also be noted that multiple patch antennas sharing a same substrate can be used to comprise a high gain array antenna. Such patch antennas can also comprise a phased array in which the beam can be electronically steered.

As noted above, both sides of the substrate 101 include such microwave antennas 105. Electric power for these microwave antennas 105 can be sourced by the aforementioned photovoltaic cells 104 (connections are not shown in FIG. 1 to help reduce visual complexity and to improve clarity).

When the apparatus 100 comprises a sphere 200, and referring again to FIG. 2, microwave transmissions 202 sourced by one or more microwave antennas 105 located on the second side 103 (i.e., the interior side) of the substrate 101 can be received by one or more microwave antennas 105 that are also located on the second side 103 on an opposing interior surface of the sphere. So configured, power can be transmitted from one part of the sphere 200 to another part thereof by such transmissions. So configured, circuitry located on a side of the sphere 200 that faces away from a suitable light source can nevertheless be supplied with operating power even though the photovoltaic cells that are located in the vicinity of that circuitry lack sufficient impinging light to produce power locally.

As noted above, some of the microwave antennas 105 are located on the first side 102 of the substrate 101. Also as noted above, however, the first side 102 of the substrate 101 also includes the photovoltaic cells 104. If desired, some or all of the microwave antennas 105 may be directly in contact with the substrate 101, the same as the photovoltaic cells 104. In lieu of the foregoing, or in combination therewith, however, one or more of the microwave antennas 105 may comprise at least an upper portion thereof that is optically transparent. So configured, such a transparent microwave antenna 105 may be positioned over a corresponding one of the photovoltaic cells 104 without unduly occluding incoming light to the latter. Such a transparent microwave antenna 105 appears in FIG. 1 as denoted by reference numeral 106. In such a case, the aforementioned optically transparent portion may be configured to serve as a protective cover for the photovoltaic cell 104, as a focusing lens, or both as desired.

By one approach, if desired, these teachings will support employing such transparent microwave antennas 105 to establish optical feedback via, at least in part, emplacement of an active medium within a resonating cavity. By one approach, at least a majority of the atoms in such an active medium are in a metastable state, resulting in population inversion as a result of electrical discharge. Accordingly, in such a case, an active medium is present, population inversion exists, and there is optical feedback.

In this illustrative example, the apparatus 100 also includes at least one photonic integrated circuit 107 coupled to the substrate 101. Such photonic integrated circuits 107 may be secured to the first side 102 of the substrate 101, to the second side 103 of the substrate 101, or may even be disposed within the material that comprises the substrate 101. FIG. 1 provides illustrative examples of each of the foregoing. As is known in the art, an integrated circuit is a chip containing electronic components that form a functional circuit. A photonic integrated circuit is a chip that contains photonic components (usually in addition to non-photonic electronic components); that is, components that work with light (photons). While in a non-photonic integrated circuit, electron flux passes through electrical components such as resistors, inductors, transistors, and capacitors, in a photonic integrated circuit, photons pass through optical components such as waveguides (equivalent to a resistor or electrical wire), lasers (equivalent to transistors), polarizers, and phase shifters. Photonic integrated circuits offer a number of advantages including miniaturization, higher speed, low thermal effects, large integration capacity, and compatibility with existing processing flows that allow for high yield, volume manufacturing, and lower prices. By one approach, a plurality of such photonic integrated circuits 107 are communicatively coupled via corresponding waveguides 108.

If desired, the apparatus 100 may also include non-photonic integrated circuits to supplement the inclusion of photonic integrated circuits.

By one approach, at least one (and possibly all or at least 90%) of the foregoing photonic integrated circuits 107 is configured to transfer electrical power from at least one of the plurality of photovoltaic cells 104 to at least one of the plurality of microwave antennas 105, including microwave antennas 105 that are disposed on the second side 103 of the substrate 101. (In FIG. 1, for the sake of clarity, only one such connection is shown at reference numeral 110.)

By another approach, in lieu of the foregoing or in combination therewith, one or more of these photonic integrated circuits 107 are operably coupled to communicate via at least one of the plurality of microwave antennas 105.

By one optional approach, the apparatus 100 may also include at least one atomic clock 109 supported by the substrate 101. An atomic clock is a clock that measures time by monitoring the frequency of atomic radiation. Electron states in an atom are associated with different energy levels, and in transitions between such states they interact with a very specific frequency of electromagnetic radiation. As such phenomena are both regular and predictable, atomic clocks provide an extremely accurate indication of time. Such an atomic clock 109 can be operably connected to, for example, the aforementioned photonic integrated circuits 107 such that the latter can leverage the availability of such timing information.

Figure 3A:
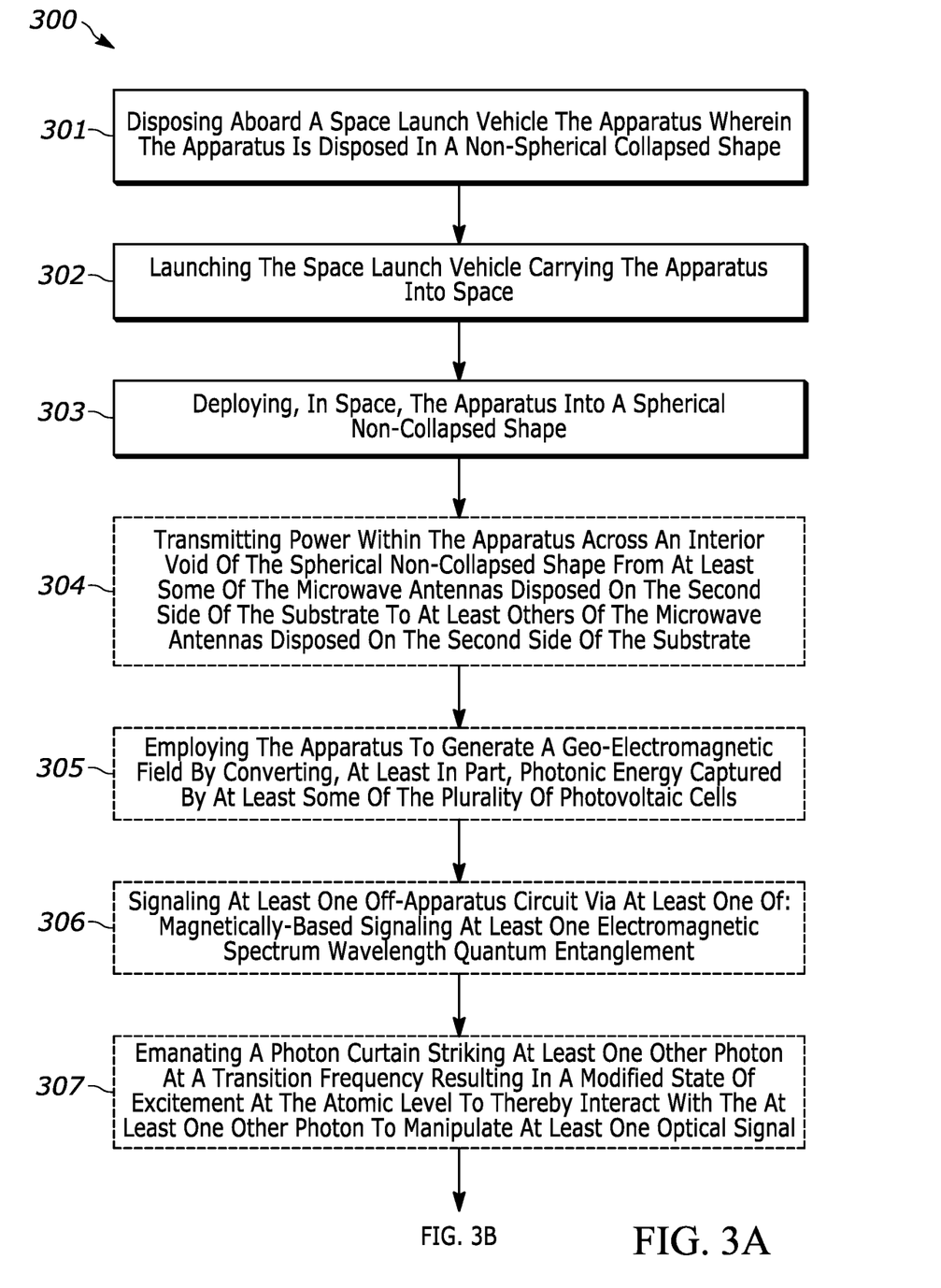
FIGS. 3A and 3B comprise a flow diagram as configured in accordance with various embodiments of these teachings.
Figure 3B:
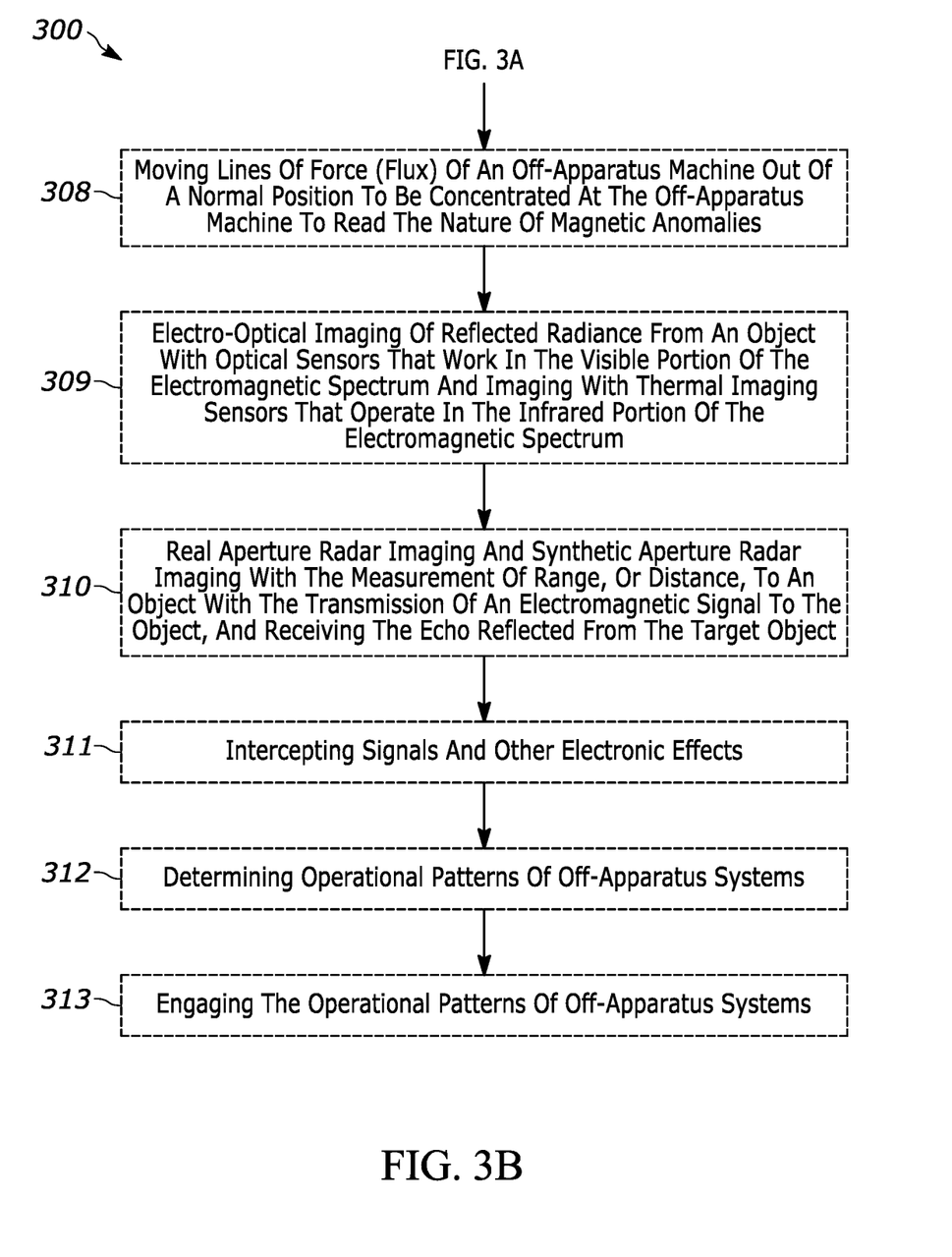

Such an apparatus 100 is highly practical in implementation and will support a wide variety of implementations and application settings. Referring now to FIG. 3, some non-limiting examples in these regards will be presented. It will be understood that the specific details of these examples are intended to serve an illustrative purpose and are not intended to suggest any particular limitations with respect to these teachings.

At block 301 of this process 300, the aforementioned apparatus 100 is disposed aboard a space launch vehicle. In this example the apparatus 100 has the current form factor of a non-spherical collapsed shape. At block 302 the space launch vehicle carrying the apparatus 100 is launched into space. As used herein, the word "space" includes low-Earth orbit, open space between planets (or even galaxies), and any non-atmospheric regions there between. In this illustrative example, it is presumed that the apparatus 100 is launched into orbit around the Earth. At block 303, the apparatus 100 is deployed into a spherical non-collapsed shape. As noted above, such deployment may include mechanically arranging the apparatus 100 into that shape and/or inflating the apparatus into that shape.

By one optional approach, and as mentioned above, at block 304 this process 300 can provide for transmitting power within the apparatus 100 across an interior void of the spherical non-collapsed shape from at least some of the microwave antennas 105 disposed on the second side 103 of the substrate 101 to at least others of the microwave antennas 105 that are also disposed on the second side 103 of the substrate 101. By one approach, the transmitting microwave antennas 105 and their corresponding receiving microwave antennas 105 are located on opposite sides of the interior of the sphere 200.

By another optional approach, in lieu of the foregoing or in combination therewith, at block 305 (and with momentary reference to FIG. 4), the apparatus 100 can be configured and employed as one pole of a geo-electromagnetic field 401 that envelops a celestial body 400 (in this illustrative example, the Earth's moon). By one approach, the foregoing may comprise generating the geo-electromagnetic field 401 by converting, at least in part, photonic energy that is captured by at least some of the plurality of photovoltaic cells 104. By one approach, the opposing pole of the geo-electromagnetic field may itself be generated by another apparatus that corresponds to the celestial body 400 (for example, by being located on or within that celestial body 400). By one approach, the geo-electromagnetic field 401 has a charge that interacts with a charge at a pole with a natural geo-electromagnetic field, such as the geomagnetic field of the Earth, to establish a hybrid artificial-natural geo-electromagnetic field.

Figure 4:
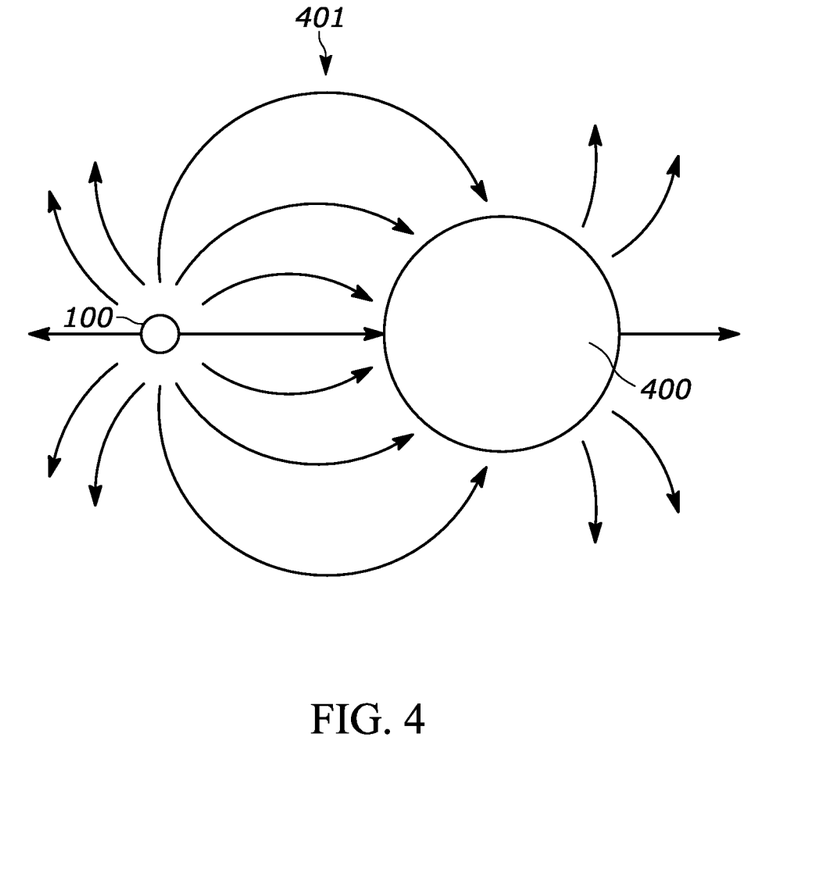
FIG. 4 comprises a schematic view as configured in accordance with various embodiments of these teachings.

By another approach, the apparatus projects the geo-electromagnetic field 401 from a single pole. By one approach, the geo-electromagnetic field 401 is deployed and sufficient to defeat an electromagnetic pulse attack, including a high altitude electromagnetic pulse attack, in the capacity of the geo-electromagnetic field 401 as a combination of electric and magnetic forces that shield machines above, on, in, or anywhere in the vicinity of a corresponding celestial body, by counteracting a high-intensity shock burst of electromagnetic energy scattering in multiple directions, every direction, or a single direction, that results from the rapid acceleration of charged particles, that may release photons, which could be in the form of x-ray or gamma radiation, and that which interacts with the magnetic field lines of the corresponding celestial body (such as the Earth) while ascending and descending, where they would become trapped, that would otherwise create an oscillating current within the celestial body's geomagnetic field, that would rapidly produce a large electromagnetic field in the form of a pulse, which would flow through electricity transmissions that damage distribution centers and fuse power lines. The same method would serve to shield commercial, civil, and military systems from space weather, including coronal mass ejections/geomagnetic disturbances, above, on, in, or anywhere in the vicinity of the corresponding celestial body.

By another approach, the geo-electromagnetic field 401 may also selectively exercise control of continental drift.

By one approach, these teachings will accommodate generating a geo-electromagnetic field 401 that couples to at least one photon. With due consideration for Maxwell's equations, these teachings enable the unification of electricity and magnetism through the foregoing process to produce the geo-electromagnetic field 401 when electric charges engage in the movement required to produce an electric current resulting in the production of a magnetic field that manipulates light traveling as electromagnetic waves. By one approach the magnetic effect produces a Lorentz force acting on photons that induces a circular motion of photons and bends light.

By one approach, the geo-electromagnetic field 401 achieves arbitrary control of photon flow as an effective magnetic field for photons, and bends light traveling as electromagnetic waves, moving light in a circular fashion, in which the geo-electromagnetic field 401 couples to photons and drives a Lorentz-like force, enabling the field to refract light and/or achieve an artificial eclipse. Such effects may also cause or deny precipitation.

The geo-electromagnetic field 401 may cause the non-standard propagation of electromagnetic waves in a variety of ways that may affect radio, microwave, optical, and other communications; radar; and electro-optical (EO) sensors. Such may also enable the geo-electromagnetic field 401 to manipulate at least radar, infrared, and magnetic signatures.

With regard to infrared sensing, as with all electromagnetic radiation, infrared radiation carries radiant energy and exhibits the behavior of both a wave and a photon, like its quantum particle. Through its ability to manipulate electromagnetic spectrum wavelengths, and the distinction between objects and their backgrounds, as well as the temperatures of precise areas, the geo-electromagnetic field 401 may affect the ways in which electronic sensors read and perceive the emissivity of both thermal and selective radiation, either confusing or clarifying the ability of such systems to read and perceive spectral characteristics. In this regard, even if there are two objects with the same physical temperature, they will not actually present the same infrared image to a sensor if their emissivity differs. For this reason, the geo-electromagnetic field 401 may create an incorrect selection of emissivity for at least infrared sensors that will give inaccurate results to a sensor field of view.

The geo-electromagnetic field 401 is able to modify background thermal noise against which infrared detectors must pick targets, either reducing or strengthening the contrast between the target and the background, and thus enable infrared sensors to more efficiently detect another system while simultaneously confusing a sensory picture for another infrared sensor. The geo-electromagnetic field 401 not only affects heating aspects of infrared radiation, but the geo-electromagnetic field 401 also affects quantum natures of photons. The geo-electromagnetic field 401 manipulates sensory pictures for both thermal and quantum infrared sensors, as well as active and passive infrared sensors. The large variety of applications that the geo-electromagnetic field 401 affects include, but are not limited to, surveillance, target acquisition, night vision, tracking, and homing.

The signature of infrared radiation from the exhaust plume of a rocket motor is a noticeable characteristic for flight vehicles. Infrared homing vehicles, or heat seeking missiles, utilize infrared light emissions to track and follow targets. The geo-electromagnetic field 401 dramatically reduces and may eliminate infrared signatures of machines and humans, including, but not limited to, spacecraft, aircraft, helicopters, naval vessels, and land vehicles.

By one approach, the geo-electromagnetic field 401 manipulates microwave regions of the electromagnetic spectrum. By one approach, the geo-electromagnetic field 401 manipulates sensory pictures for spectral, hyperspectral, and multispectral imaging systems, manipulating the fine wavelength resolutions of recorded spectra across the vast expanse of bands in the electromagnetic spectrum.

By yet another optional approach, and again in lieu of the foregoing or in combination therewith, at block 306 these teachings will accommodate configuring and employing the apparatus 100 to signal one or more off-apparatus circuits. The latter may be disposed on other similar apparatuses, on other spacecraft, or on other celestial bodies including planets, moons, asteroids, and so forth. These teachings are highly flexible in practice and will accommodate magnetically-based signaling, signaling via at least one electromagnetic spectrum wavelength, and quantum entanglement.

As regards the latter, one or more of the aforementioned photonic integrated circuits 107 can be configured to communicate using quantum entanglement. Those skilled in the art will understand that quantum entanglement is a physical phenomenon that occurs when a group of particles are generated, interact, or share spatial proximity in a way such that the quantum state of each particle of the group cannot be described independently of the state of the others, including when the particles are separated by a large distance. In a typical application setting for this apparatus 100, quantum entanglement pertaining to photons can be particularly appropriate.

By yet another optional approach, again in lieu of the foregoing or in combination therewith, at block 307 these teachings will accommodate emanating a photon curtain (i.e., an omni-directional emanation) striking at least one other photon at a transition frequency that results in a modified state of excitement at the atomic level to thereby interact with the at least one other photon to thereby manipulate at least one optical signal.

And as yet another illustrative example as regards the flexibility of these teachings, if desired, one or more of the aforementioned photonic integrated circuits 107 can be configured to detect such things as different kinds of atmospheric phenomena (such as various weather phenomena) and/or different kinds of celestial phenomena. The detection of such phenomena can occur as a secondary purpose while the apparatus 100 carries out one or more prioritized activities.

By another approach, at block 308 the apparatus moves lines of force (flux) of an off apparatus machine out of a normal position to be concentrated at the off apparatus machine to read the nature of magnetic anomalies. This method can be employed for a metallic apparatus or machine and even a non-metallic apparatus or machine with magnetic anomaly detection equipment. Magnetic susceptibilities are present in almost all materials (including even some organic structures). Even if the magnetic susceptibility of a non-metallic system is millions of times smaller than a metallic system, the effects of the geo-electromagnetic field 401 may enable magnetic anomaly detection equipment to detect and target such a system. By another approach, the geo-electromagnetic field 401 expands the range of magnetic anomaly detection equipment by at least hundreds of kilometers.

By one approach, at block 309 the apparatus engages in passive remote sensing techniques that include, but are not limited to, electro-optical imagery that images reflected radiance from an object with optical sensors 107, 108, and 106 that work in the visible portion of the electromagnetic spectrum. By another approach, at block 309 the apparatus images with thermal imaging sensors 107, 108, and 106 that operate in the infrared portion of the electromagnetic spectrum. Thus, the apparatus possesses multiple imagery sensors which are reflected radiance sensors that see in the optical electromagnetic spectrum to produce images. The apparatus has a lens 106 that projects radiation from a scene onto an array of detectors 107 and 108.

The apparatus 100 is capable of more than one panchromatic band, more than three color bands, which cover the visible spectrum, and several hundred or more bands encompassing the visible spectrum, as well as the shortwave and near-infrared bands of the electromagnetic spectrum, to identify materials of a scene and discriminate between different classes of material of the scene. The apparatus is thus capable of three common types of passive sensing, including: hyperspectral, multi spectral, and panchromatic/color.

Prior forms of space-borne electro-optical imagery relied on an external source, normally the Sun, to illuminate a target area. By one approach, the apparatus projects irradiance onto a target for image capture, as well as manipulates this irradiance for the corresponding ability to manipulate the image while it is being captured. In addition, the apparatus possesses the ability to manipulate radiance by manipulating the angle of light propagating onto the image, whether the light is emanating from the apparatus, the Sun, or any other light source. Thus, the ability of the apparatus to manipulate light, as well as climatic effects of a celestial body, enables the apparatus to uncomplicate the recovery of reflectance spectra when engaged in the variety of sensing phenomena that it is capable of.

By another approach, the apparatus engages in thermal infrared sensing using infrared energy as heat. By yet another approach, the apparatus engages in quantum infrared sensing. The apparatus therefore records thermal or infrared images to determine cloud heights and types, calculate water and land temperatures, and locate ocean features.

By one approach, at block 310 various components (such as those denoted by reference numerals 105, 107, and 108) of the apparatus comprise a real aperture radar by measuring the range, or distance, to an object with the transmission of an electromagnetic signal to the object, and receiving the echo reflected from the target object. By one approach this real aperture radar images a target scene by acquiring strips as the apparatus moves along a flight path. The apparatus may separate objects in the target scene, for example, by implementing two methods: in the cross-track direction, which is known by those skilled in the art as the range direction, the radar echoes are separated by using a time delay method between back-scattered echoes from different surface elements; and in the along-track direction, which is also known as azimuth direction by those skilled in the art, the angular size is employed to separate surface pixels. Together, a real aperture radar image is generated.

By another approach, and again in lieu of the foregoing or in combination therewith, at block 310 various components (such as those denoted by reference numerals 105, 107, and 108) of the apparatus comprise a synthetic aperture radar by measuring the range, or distance, to an object with the transmission of an electromagnetic signal to the object, and receiving the echo reflected from the target object. By one approach, such a synthetic aperture radar images a target scene by acquiring strips as the apparatus moves along a flight path. The apparatus may separate objects in the target scene, for example, by implementing two methods: in the cross-track direction, which is known by those skilled in the art as the range direction, the radar echoes are separated by using a time delay method between back-scattered echoes from different surface elements; in the along-track direction, which is also known as azimuth direction by those skilled in the art, the Doppler history is employed to separate surface pixels. Together, a synthetic aperture image is generated. By utilizing time delay with Doppler history results, the synthetic aperture radar images of the apparatus have resolutions that can be independent of the distance between the apparatus and the target scene which the synthetic aperture radar is imaging.

By yet another approach, the apparatus is capable of bending the line of radar line-of-sight along the range in which the object being imaged (the scatterer or the target) and the radar are connected. These effects enable the apparatus to neglect measurements from the nadir track along the surface, or the ground, to the scatterer. Thus, the look angle and the incidence angle are manipulated by the apparatus such that surface curvature effects can be neglected, and the look angle can be equivalent to an incidence angle at all times. Therefore, the incidence angle does not have to be larger than a look angle for curved surfaces even if topography is present in the target scene, and the local incidence angle does not have to vary in a radar image between pixels.

Thus, the apparatus need not move to generate synthetic aperture radar imagery due to the ability of the apparatus to bend electromagnetic waves. Electromagnetic waves can be transmitted sequentially regardless of position—moving or stationary—and the echoes can be collected to enable the system to electronically digitize and store data and information for subsequent processing regardless of satellite maneuvering or non-maneuvering. Transmission and reception can occur at different times, or simultaneously, and can therefore map to different positions under any maneuver or non-maneuver scenario. Regardless of maneuver or non-maneuver, a well-ordered combination of signals that are received can build the virtual aperture that can be much longer than the dimensions of the physical antenna width, or much shorter than the dimensions of physical antenna width. The range direction can be perpendicular, or non-perpendicular, to the flight path and perpendicular, or non-perpendicular, to the direction of the azimuth—the along-track direction in line with positions of objects that are within the field of view of the antenna. But in fact, all objects and target scenes are in view of the satellite at any time regardless of look angle and incidence angle.

By yet another optional approach, at block 311 the apparatus collects signal data and information in free space, such as in the orbit of the Earth, or in the atmosphere, that involves communications within signals. As examples, such signals may be radio, microwave, or optical. By another approach, the apparatus collects electronic data and information contained within the aforementioned signals themselves, such as the measurement of a frequency, pulse repetition rate, or other characteristics of a particular radar system as an example. The apparatus can be configured to detect speech within voice communications over such signals. As a further example, the apparatus detects telemetry signals. Such signal collection may also occur in regions of the electromagnetic spectrum such as within magnetic fields or the infrared region.

By one approach, the apparatus enables descriptions of emission characteristics, emitter functions, signal structures, modes of operation, and/or systems associations with, for example, such emitters as jammers, beacons, radars, and navigational signals. These may be, but are not limited to, radio, microwave, and optical systems. Thus, the apparatus may obtain signal parameters that define capabilities and roles that an emitter may play in a larger system. As an example, this may include, but is not limited to, a radar on the ground locating aircraft. At block 312 these methods enable the determination of operational patterns of systems. At block 313 the apparatus engages the operational patterns of systems.

By one approach, the photonic integrated circuit 107 enables optoacoustic capabilities, such as photoacoustic imaging, where the laser energy of the sphere is interactive with the sonar capabilities of the sphere that enables ultrasonic emissions. Thus, the apparatus constitutes a sound transmitter, which may possess a sound receiver with a projector, that creates and projects a pulse of sound for sonar applications across domains.

Those skilled in the art will recognize that a wide variety of modifications, alterations, and combinations can be made with respect to the above-described embodiments without departing from the scope of the invention, and that such modifications, alterations, and combinations are to be viewed as being within the ambit of the inventive concept.

What is claimed is:

1. An apparatus comprising:
a substrate having a first side and a second side that is opposite the first side;
a plurality of photovoltaic cells disposed on the first side of the substrate;
a plurality of microwave antennas disposed on both the first side of the substrate and the second side of the substrate; and
at least one photonic integrated circuit operably coupled to the substrate and to at least one of the plurality of photovoltaic cells to thereby receive electrical power therefrom.

2. The apparatus of claim 1 wherein the substrate comprises a flexible substrate.

3. The apparatus of claim 1 wherein the at least one photonic integrated circuit is configured to transfer electrical power from at least one of the plurality of photovoltaic cells to at least one of the plurality of microwave antennas disposed on the second side of the substrate.

4. The apparatus of claim 1 wherein the at least one photonic integrated circuit comprises a plurality of photonic integrated circuits, wherein at least some of the photonic integrated circuits are communicatively coupled via corresponding waveguides.

5. The apparatus of claim 1 wherein the at least one photonic integrated circuit is operably coupled to communicate via at least one of the plurality of microwave antennas.

6. The apparatus of claim 1 wherein the at least one photonic integrated circuit is configured to detect at least one of:
atmospheric phenomena; and
celestial phenomena.

7. The apparatus of claim 1 further comprising:
at least one atomic clock supported by the substrate.

8. The apparatus of claim 1 wherein the substrate comprises a sphere.

9. The apparatus of claim 8 wherein the substrate can be selectively shifted from a collapsed non-spherical state to a deployed spherical state.

10. The apparatus of claim 1 wherein the apparatus is configured to form one pole of a geo-electromagnetic field that envelops a celestial body.

11. The apparatus of claim 10 wherein an opposing second pole of the geo-electromagnetic field is generated by an apparatus that corresponds to the celestial body.

12. The apparatus of claim 1 wherein at least some of the plurality of microwave antennas disposed on the first side of the substrate comprise an optically transparent portion that serves as both a protective cover and a focusing lens.

13. The apparatus of claim 1 wherein the at least one photonic integrated circuit is configured to communicate using quantum entanglement.

14. The apparatus of claim 1 wherein the apparatus is configured, at least in part, as a retro-directive phased array long-range power transmission apparatus.

15. A method comprising:
disposing aboard a space launch vehicle an apparatus comprising:
a substrate having a first side and a second side that is opposite the first side;
a plurality of photovoltaic cells disposed on the first side of the substrate;
a plurality of microwave antennas disposed on both the first side of the substrate and the second side of the substrate; and
a plurality of photonic integrated circuits that are operably coupled to the substrate and with each of the photonic integrated circuits operatively coupled to at least one of the plurality of photovoltaic cells to thereby receive electrical power therefrom, wherein at least some of the photonic integrated circuits are communicatively coupled to one another via corresponding waveguides such that the communicatively coupled photonic integrated circuits process data and information and possess memory;
wherein the apparatus is disposed in a non-spherical collapsed shape;
launching the space launch vehicle carrying the apparatus into space;
deploying, in space, the apparatus into a spherical non-collapsed shape; and
employing the apparatus to generate a geo-electromagnetic field by converting, at least in part, photonic energy captured by at least some of the plurality of photovoltaic cells.

16. The method of claim 15 further comprising:
transmitting power within the apparatus across an interior void of the spherical non-collapsed shape from at least some of the microwave antennas disposed on the second side of the substrate to at least others of the microwave antennas disposed on the second side of the substrate.

17. The method of claim 15 wherein at least some of the plurality of microwave antennas comprise transparent microwave antennas, and wherein the method further comprises:
employing the transparent microwave antennas to establish optical feedback via, at least in part, emplacement of an active medium within a resonating cavity.

18. The method of claim 15 further comprising:
generating a geo-electromagnetic field that couples to at least one photon.

19. The method of claim 15 further comprising employing the apparatus to:
signal at least one off-apparatus circuit via at least one of:
magnetically-based signaling;
at least one electromagnetic spectrum wavelength;
quantum entanglement.

20. The method of claim 15 further comprising employing the apparatus to:
emanate a photon curtain striking at least one other photon at a transition frequency resulting in a modified state of excitement at the atomic level to thereby interact with the at least one other photon to manipulate at least one optical signal.

* * * * *